United States Patent [19]

Digoy

[11] 3,928,866

[45] Dec. 23, 1975

[54] SEMICONDUCTOR RADIATION DETECTOR AND METHOD OF MANUFACTURING SAME

[75] Inventor: Jean Louis Digoy, Caen, France

[73] Assignee: U.S. Philips Corporation, New York, N.Y.

[22] Filed: July 9, 1973

[21] Appl. No.: 377,797

[30] Foreign Application Priority Data

July 10, 1972 France .............................. 72.24928

[52] U.S. Cl. ........................ 357/30; 357/55; 357/32; 357/58

[51] Int. Cl. .............................................. H01l 15/00

[58] Field of Search ... 317/235 N, 235 AD, 235 AJ; 357/30, 55, 32, 58

[56] References Cited

UNITED STATES PATENTS

| | | | |
|---|---|---|---|
| 3,413,528 | 11/1968 | Docer | 317/234 |
| 3,593,067 | 7/1971 | Flynn | 317/234 R |
| 3,697,825 | 10/1972 | Meuleman | 317/234 R |
| 3,742,215 | 6/1973 | Meuleman | 250/83 R |

*Primary Examiner*—Martin H. Edlow
*Attorney, Agent, or Firm*—Frank R. Trifari; Ronald L. Drumheller

[57] ABSTRACT

A radiation detector comprising a semiconductor body having two oppositely located major surfaces which are substantially parallel to each other, a surface layer of a first conductivity type adjoining a first of said major surfaces, said surface layer in the semiconductor body adjoining a substantially intrinsic intermediate region which extends through the semiconductor body down to substantially the second major surface, an annular surface region of the second conductivity type being present at the second major surface, the first major surface comprising two substantially concentric grooves extending in the semiconductor body from the first major surface down to a depth which is larger than the thickness of the surface layer of the first conductivity type.

8 Claims, 5 Drawing Figures

SEMICONDUCTOR RADIATION DETECTOR AND METHOD OF MANUFACTURING SAME

BACKGROUND OF THE INVENTION

The invention furthermore relates to a method of manufacturing such a radiation detector.

As is known, an intrinsic zone of a semiconductor diode having NIP structure is often used for the detection and, for example, the spectrometry of radiation or particles.

In this connection "intrinsic" is to be understood to include any semiconductor in which the densities of electrons and holes in the case of thermal equilibrium are substantially equal, in which the semiconductor material may either have a great purity or may simultaneously comprise donors and acceptors in such a ratio that they substantially compensate for each other.

When an incident particle penetrates into the intrinsic zone, it forms one or more electron-hole pairs at that area so that a current is produced which can be derived and detected in the form of voltage pulses, for example, via a suitable resistor. The resulting pulses may furthermore be analysed by means of electronic apparatus specially designed for this purpose.

It has been established that, in order to obtain a diode having a great effectiveness, the surface of the junction and the effective volume of the intrinsic zone must be as large as possible. In connection herewith, a detector having a NIP structure is often used which is usually obtained from a monocrystalline silicon or germanium slice, usually of the p-type, in which by means of an n-type impurity, for example lithium, both an n-type region N and a compensated or intrinsic region I is produced.

In most of the cases, such a detector is of the planar type and the entrance window for the radiation has been obtained by locally removing the excess of the p-type layer, the edge of the recess or cavity thus formed being covered with a thin metal layer, for example, of platinum or gold, so as to obtain at said surface a uniformly distributed potential.

It is furthermore known that in a radiation detector the main parameters which influence the quality are the value of the leakage current, the value of the breakdown voltage, and the noise level. These parameters are mutually dependent and depend to a considerable extent upon the quality of the crystal from which the detector is manufactured, on the quality and the shape of the various regions N, I and P, and on the state of the entrance window which may be covered with a disturbed layer as a result of the manufacturing treatments.

An already known method to mitigate some of these drawbacks consists in that at the surface of the detector, after the formation of the NIP structure and usually from the surface which is exposed to the radiation, a guard ring is provided around the sensitive surface of the detector.

Said guard ring may be obtained by the local diffusion of impurities in the surface to be exposed to the radiation, in which a zone of a conductivity type opposite to that of the diode zone adjoining said surface is provided. Such a guard ring may also be replaced by a groove which extends from one of the major surfaces of the detector in the semiconductor body, the lower side of said groove penetrating into the substantially intrinsic region. With said groove, the leakage current path can be elongated and in particular the surface leakage currents can be blocked. Actually, however, electron-hole pairs which produce a current are formed also at the periphery of the detector and in the region which is bounded by the guard ring. This current is derived in measurements in the sensitive region of the detector and then interfere with the results.

When the detector having a NIP structure has a cavity or recess which forms the entrance window, said recess is usually provided in two steps so as to obtain a better quality of the surface at the area of the entrance window. The edge of the recess then shows a small step at the area of which the crystal lattice is generally disturbed. This step or this unevenness adjoins the interface between the semi-conductor layer of the original conductivity type and the intrinsic layer, which gives rise to electric instability and injection of the charge carriers, so to the formation of parasitic leakage currents.

SUMMARY OF THE INVENTION

It is one of the objects of the present invention to provide a detector for electromagnetic radiation and/or particles which shows small leakage currents and stable characteristics.

According to the invention, a radiation detector of the type described in the preamble is characterized in that the grooves have unequal depths, a first groove extending only down to in the intrinsic intermediate region, its lower side adjoining only the intrinsic intermediate region, the second deeper groove extending through the substantially intrinsic intermediate region and down to the annular surface region of the second conductivity type, said annular region extending between the lower side of the second deeper groove and the second major surface.

Such a detector is preferably manufactured by using a method which is characterized in that a surface layer of the first conductivity type is provided at a first major surface of a semiconductor body of the second conductivity type, that subsequently two substantially concentric grooves of unequal depths are provided from the first major surface in the semiconductor body and extend at least through the surface layer of the first conductivity type, a substantially intrinsic intermediate region being formed by drifting of impurities provided in the surface layer from said surface in the adjoining part of the semiconductor body under the influence of an electric field, said formation of the intrinsic intermediate region being at least once interrupted to provide at least the first shallow groove, the depth of the first groove being chosen to be so that the lower side of said groove remains entirely within the already formed part of the intrinsic intermediate region and that the formation of the intrinsic intermediate region is then continued until the formed intrinsic intermediate region extends substantially down to the second oppositely located major surface of the semiconductor body.

The volume and the shape of the remaining non-compensated surface region of the semiconductor body depend upon the depth of the grooves, on their width and on the mutual distance thereof. By giving said grooves different depths and by choosing the other parameters judiciously, it is possible to obtain an annular region the boundary of which with the intrinsic region is rounded in shape.

Below a deep groove, the compensating impurities can no longer circulate and immediately below said groove an island of the original material is thus obtained. Below a less deep groove which penetrates only into the first part of the intrinsic layer, the impurities circulate with difficulty only so that a larger island of original material remains at that area. By combining a deep groove and a less deep groove with one another it is possible to give the island of original material rounded shapes, so that the behaviour of the breakdown voltage is varied which, as is known, depends upon the radius of curvature of the junction. In this manner a detector may also be obtained of which the contour of the sensitive surface or entrance window is readily defined and of which the effect of the leakage currents is considerably reduced due to the presence of two concentric annular surface regions of the second conductivity type.

The part of the intrinsic intermediate region bounded by said two annular surface regions constitutes an effective guard ring which surrounds the entrance window for the radiation but is readily insulated from the sensitive region by the inner groove and the inner annular surface region of the second conductivity type.

The radiation detector may furthermore comprise a second region of the second conductivity type which is present at the periphery and which has such dimensions that a metal layer can be provided on it for contacting purposes, said outer annular surface region moreover contributing to improving the breakdown voltage of the detector. In order to achieve this, the groove which penetrates only into the first part of the intrinsic layer without passing through it, so the less deep groove, is provided nearer to the edge of the semiconductor body and around the deeper groove. A recess is preferably provided at the second major surface of the semiconductor body, the bottom of said recess comprising the total surface of the entrance window, of the inner annular surface region and of the guard ring and a part of the surface of the outer annular surface region. The acute angle formed by the meeting of the edge and the bottom of the said recess then falls within the outer annular surface region. Moreover, the step of unevenness in the edge of the recess formed during the renewed grinding of the bottom of the said recess is no longer present at the interface between the semiconductor layer of original material and the intrinsic intermediate region but within the original material. As a result of this, no leakage currents are formed any longer at the area of said unevenness.

It is to be noted that radiation detectors having two concentric grooves are known per se, for example, from "IEEE Transactions on Nuclear Science", June 1966, pp. 214–220. In this case, however, the grooves have been provided after the formation of the intrinsic intermediate region and they do not influence the shape of the said region. Moreover, said grooves have the same depths and they only serve to interrupt the surface layer of the first conductivity type which is thereby subdivided into three parts which are separated from each other and are each provided with an electric connection.

The semiconductor body preferably is a mono-crystalline p-type body of germanium, silicon or cadmium telluride, the n-type surface layer and the intrinsic intermediate region being formed by deposition and/or diffusion and drift of lithium.

DETAILED DESCRIPTION

Figure 1:
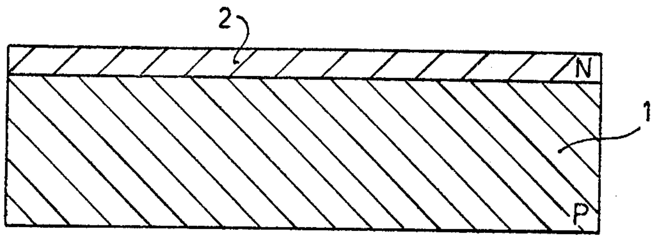
Figure 2:
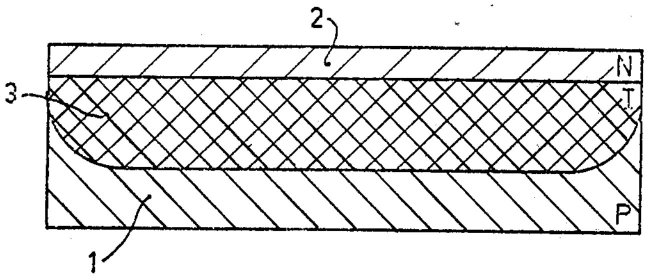

The invention will be described in greater detail with reference to an embodiment and the accompanying drawing.

FIGS. 1 to 5 show various stages in the manufacturing process of a detector according to the invention in which the method of the invention has been used.

It is to be noted that in the drawing the dimensions have not been drawn to scale for clarity.

Figure 4:
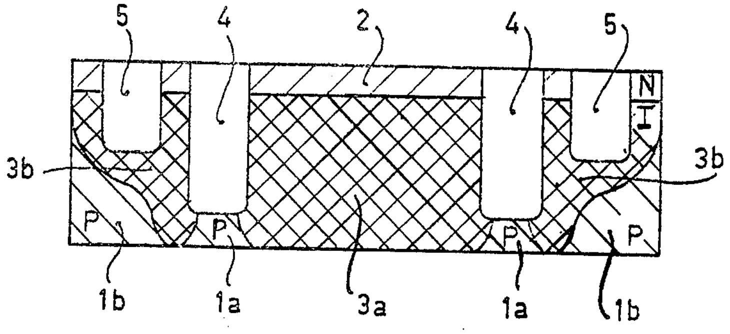
Figure 5:
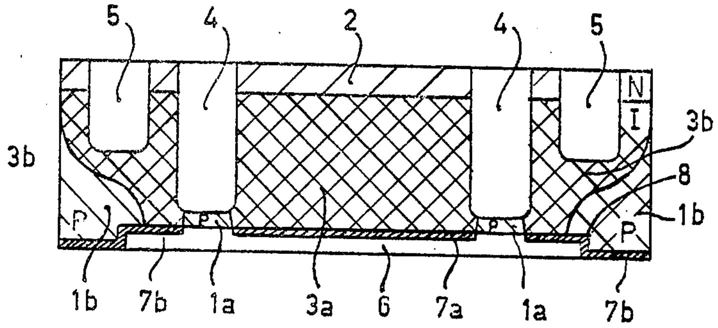

The radiation detector, a diagrammatic cross-sectional view of which is shown in FIG. 5 and the manufacture of which will be explained with reference to FIGS. 1 to 4, comprises a region 1 (FIG. 1) which originally is entirely of the second conductivity type, for example p-type, and a layer 2 of the opposite, first conductivity type, so in this case n-type. Two annular grooves 4 and 5 are provided from the surface of the layer 2 and a recess (FIG. 5) is provided on the other major surface to be exposed to the radiation. The detector as shown in FIG. 5 has two annular concentric surface regions **1*a* and 1*b*** of the original conductivity type, so the p-type.

Two metal layers **7*a* and 7*b* provided on the surface-adjoining parts of the intrinsic layers 3*a* and 3*b*** serve for contacting purposes.

In order to obtain such a detector, starting material may be a monocrystalline body 1 of the second conductivity type, for example of p type silicon. A layer 2 having impurities which cause the first conductivity type, so the n-type, is provided on one of the major surfaces, for example, by diffusion. FIG. 1 shows the semiconductor body after said operation. By means of a bias voltage in the reverse direction applied across the p–n junction formed between the p-type region 1 and the n-type surface layer 2, an electric field may be produced in known manner under the influence of which impurities from the surface layer drift further into the body, an substantially intrinsic region adjoining the surface layer 2 being formed by compensation.

After a first part 3 (FIG. 2) of the intrinsic intermediate region has been formed, the operation is interrupted after which two concentric grooves 4 and 5 are provided, for example, by grinding.

Figure 3:
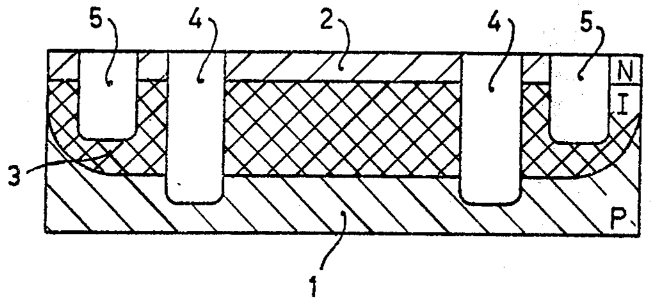

As shown in FIG. 3, the groove 4 extends through said first part 3 of the intrinsic intermediate region, while groove 5 terminates in said part 3. By resuming the formation of the intrinsic intermediate region, the structure shown in FIG. 4 is obtained having an inner annular region **1*a* below the groove 4 and an annular surface region 1*b* present at the periphery of the monocrystalline semiconductor body. The two surface regions 1*a* and 1*b* and the grooves 4 and 5 divide the intrinsic intermediate region into two concentric parts, the first part 3*a* which forms the sensitive volume of the detector and the second part 3*b*** which may be used as a guard ring.

In the embodiment, a recess 6 is then provided in the second major surface of the detector. Said recess is meant on the one hand to remove the surface layer of the crystal lattice which may be disturbed by the various treatments performed, and on the other hand to obtain an entrance window (FIG. 5) for the radiation having a small thickness and a good definition. In order to facilitate the contacting and to improve the characteristics of the detector, metal layers **7*a* and 7*b*, respectively, for example of gold or platinum, are provided on the bottom and the edge of the recess 6** and on the parts 3*a* and 3*b* of the substantially intrinsic intermediate region 3.

Due to the presence of the groove 5, an annular zone 1*b* which is present at the periphery has been obtained, in which the acute angle 8 formed by the edge and the bottom of the recess, as well as the unevenness (not shown) in the edge of the recess which has been formed in that the recess is usually provided in two steps, fall within said annular zone 1*b* so that no leakage currents will be formed at said edge. Furthermore, the leakage currents are reduced by the grooves 4 and 5 which adjoin the intrinsic intermediate region and by the guard ring structure which is formed by the part 3*b* of the intrinsic intermediate region 3.

What is claimed is:

1. A radiation detector comprising a semi-conductor body having two oppositely located major surfaces which are opposed to each other, a surface layer of a first conductivity type adjoining a first of said major surfaces, said surface layer in the semiconductor body adjoining a substantially intrinsic intermediate region which extends through the semiconductor body to substantially the second major surface, an annular surface region of the second conductivity type being present at the second major surface, the first major surface comprising two substantially concentric grooves extending into the semiconductor body from the first major surface to a depth which is larger than the thickness of the surface layer of the first conductivity type, the grooves having unequal depths, a first one of said grooves terminating in the substantially intrinsic intermediate region, the second one of said grooves being deeper and extending through the substantially intrinsic intermediate region to the annular surface region of the second conductivity type, said annular region extending between the lower side of the second deeper groove and the second major surface.

2. A radiation detector as claimed in claim 1, characterized in that viewed on the first major surface the deeper second groove is situated within and is surrounded by the first shallower groove, a second annular surface region of the second conductivity type which extends at least partly between the lower side of the first groove and the second major surface and which is separated from the first groove by the substantially intrinsic intermediate region being present at the second major surface in addition to the already mentioned first annular surface region of the second conductivity type.

3. A radiation detector as claimed in claim 2, characterized in that a recess is present at the second major surface, in which both the part of the substantially intrinsic intermediate region extending mainly within the second deeper groove and the part of the intermediate layer present mainly outside said groove extend within the area of the recess substantially down to the second major surface, said parts being separated from each other at said major surface by the annular surface region of the second conductivity type present between the lower side of the second groove and the second major surface, the second annular surface region of the second conductivity type also partly adjoining the second major surface within the area of the recess.

4. A radiation detector as claimed in claim 3, characterized in that the edge of the recess adjoins in its entirely and exclusively the second annular surface region of the second conductivity type.

5. A method of manufacturing a radiation detector as claimed in claim 1, characterized in that a surface layer of the first conductivity type is provided at a first major surface of a semiconductor body of the second conductivity type, that two substantially concentric grooves of unequal depths are provided from the first major surface in the semiconductor body and extend at least through the surface layer of the first conductivity type, a substantially intrinsic intermediate region being formed by drifting of impurities provided in the surface layer under the influence of an electric field from said surface layer in the adjoining part of the semiconductor body, said formation of the substantially intrinsic intermediate region being at least once interrupted to provide at least the first shallow groove, the depth of the first groove being chosen to be so that the lower side of said groove remains entirely within the already formed part of the substantially intrinsic intermediate region and that the formation of the substantially intrinsic intermediate region is then continued until the formed substantially intrinsic intermediate region extends substantially down to the second oppositely located major surface of the semiconductor body.

6. A method as claimed in claim 5, characterized in that starting material is a monocrystalline p-type semiconductor body of a material belonging to the group formed by germanium, silicon and cadmium telluride, the n-type surface layer and the substantially intrinsic intermediate region being formed by diffusion and drift of lithium.

7. A method as claimed in claim 5, characterized in that the two grooves of unequal depths are provided during the same interruption of the formation of the substantially intrinsic intermediate region, the deeper groove being formed entirely through the already formed part of the intrinsic intermediate region and down to in the still remaining p-type part of the semiconductor body.

8. A method as claimed in claim 5, characterized in that the inner of the two substantially concentric grooves is provided to have a greater depth than the outer of said grooves and that a recess is provided at the second major surface after the formation of the substantially intrinsic intermediate region, which recess is so large that the part of the substantially intrinsic intermediate region extending mainly within the inner deeper groove, the part of the intermediate region present outside said inner groove, an inner annular surface region of the second conductivity type present between the deeper groove and the second major surface and separating said parts of the substantially intrinsic intermediate region from each other, and a part of a second outer annular surface region of the second conductivity type adjoin the second major surface within the edge of said recess.

* * * * *